US008501604B2

(12) United States Patent
Singh

(10) Patent No.: US 8,501,604 B2
(45) Date of Patent: Aug. 6, 2013

(54) METHOD FOR FORMING A DOPED REGION IN A SEMICONDUCTOR LAYER OF A SUBSTRATE AND USE OF SUCH METHOD

(75) Inventor: Sukhvinder Singh, Leuven (BE)

(73) Assignee: IMEC, Leuven (BE)

( * ) Notice: Subject to any disclaimer, the term of this patent is extended or adjusted under 35 U.S.C. 154(b) by 101 days.

(21) Appl. No.: 13/162,507

(22) Filed: Jun. 16, 2011

(65) Prior Publication Data

US 2011/0309489 A1 Dec. 22, 2011

Related U.S. Application Data

(60) Provisional application No. 61/356,002, filed on Jun. 17, 2010.

(51) Int. Cl.
*H01L 21/24* (2006.01)

(52) U.S. Cl.
USPC ........ 438/537; 438/71; 438/98; 257/E21.156; 257/734; 216/79

(58) Field of Classification Search
CPC ............ H01L 21/24; H01L 23/48; H01L 31/18
USPC ...................... 257/E21.156, E23.01, E31.124, 257/734; 438/57, 71, 72, 79, 87, 98, 537; 216/24, 74, 79, 80, 83
See application file for complete search history.

(56) References Cited

U.S. PATENT DOCUMENTS

| 5,928,438 | A | 7/1999 | Salami et al. | |
|---|---|---|---|---|
| 7,613,007 | B2* | 11/2009 | Amey et al. | 361/763 |
| 7,701,052 | B2* | 4/2010 | Borland et al. | 257/700 |
| 8,071,418 | B2* | 12/2011 | Rohatgi et al. | 438/87 |
| 8,088,297 | B2* | 1/2012 | Kuebelbeck et al. | 216/79 |
| 8,110,431 | B2* | 2/2012 | Rohatgi et al. | 438/98 |
| 8,148,191 | B2* | 4/2012 | Klein et al. | 438/72 |
| 8,334,163 | B1* | 12/2012 | Hu et al. | 438/71 |
| 2010/0267187 | A1* | 10/2010 | Funakoshi | 438/72 |
| 2011/0120552 | A1 | 5/2011 | Meyer et al. | |

FOREIGN PATENT DOCUMENTS

| DE | 10 2008 033 169 A1 | 11/2009 |
|---|---|---|
| DE | 10 2009 034594 A1 | 8/2010 |
| WO | WO 2010/049229 A2 | 5/2010 |

OTHER PUBLICATIONS

Huster, Frank, Investigation of the Alloying Process of Screen Printed Aluminium Pastes for the BSF Formation on Silicon Solar Cells, 20$^{th}$ European Photovoltaic Solar Energy Conference, Barcelona, Spain, Jun. 2005, pp. 1466-1469.

(Continued)

*Primary Examiner* — Chris Chu
(74) *Attorney, Agent, or Firm* — Knobbe Martens Olson & Bear LLP

(57) ABSTRACT

A method of forming a doped region in a semiconductor layer of a substrate by alloying with doping elements is disclosed. In one aspect, the method includes screen printing a paste layer of doping element paste to the substrate and firing the screen printed paste layer of doping element paste, wherein a highly pure doping element layer is applied to the semiconductor layer after which the paste layer is screen printed to the doping element layer.

22 Claims, 10 Drawing Sheets

OTHER PUBLICATIONS

Mai, L., et al., Improved Process for the Formation of Al-Alloyed Emitter in N-Type Solar Cells, 18$^{th}$ Int. Photovoltaic Science Engineering Conf., India, Jan. 2009, 2 pages.

Page, M.R., et al., Progress in Silicon Heterojunction Devices by Hot-Wire CVD, Conference Paper, 14$^{th}$ Workshop on Crystalline Silicon Solar Cells and Modules, National Renewable Energy Laboratory, Aug. 2004, 7 pages.

Schneider, A., et al., Al BSF for Thin Screenprinted Multicrystalline Si Solar Cells, 17$^{th}$ European Photvoltaic Solar Energy Conference, Munich, Germany, Oct. 2001, pp. 1768-1771.

Sugianto, A., et al., Investigation of Al-Doped Emitter on N-Type Rear Junction Solar Cells, IEEE Transactions on Electron Devices, vol. 57, No. 2, Feb. 2010, pp. 525-529.

Extended European Search Report for European Patent Application No. 11166861.2-1528 dated Jul. 25, 2011.

Ly Mai et al., "Rear junction laser doped solar cells on CZ n-type silicon", Photovoltaic Specialists Conference (PVSC), 2009 34th IEEE, IEEE, Piscataway, NJ, USA, Jun. 7, 2009, pp. 1811-1815.

* cited by examiner ical aspects of this application is called the doping element paste.

METHOD FOR FORMING A DOPED REGION IN A SEMICONDUCTOR LAYER OF A SUBSTRATE AND USE OF SUCH METHOD

CROSS REFERENCE TO RELATED APPLICATIONS

This application claims priority under 35 U.S.C. §119(e) to U.S. provisional patent application 61/356,002 filed on Jun. 17, 2010, which application is hereby incorporated by reference in its entirety.

BACKGROUND OF THE INVENTION

1. Field of the Invention

The disclosed technology relates to a method of forming a doped region in a semiconductor layer of a substrate and the use of such method.

2. Description of the Related Technology

Methods for forming a doped region in a semiconductor layer of a substrate are already known to the person skilled in the art.

For example for n-type silicon photovoltaic cells an emitter can be realized by using p-type doping elements such as boron or aluminum. Good solar cell results have been obtained by using boron diffusion for the emitter formation process. However, belt firing of screen printed aluminum paste to form the emitter by Al alloying can be a good alternative, since it is a much simpler approach compared to boron diffusion in a tube furnace. Moreover a large knowledge base is available for this kind of processes since screen printing and firing of an aluminum paste is used industrially for the formation of a back surface field (BSF) for p-type photovoltaic cells.

Al alloying by screen printing and firing may however lead to discontinuities in the doped region. This is related to the alloying process, wherein the alloying action of the aluminum from the paste particles with the silicon wafer starts locally at points where the Al and the silicon are in intimate contact. For p-type cells, it has been reported (F. Huster, "Investigation of the alloying process of screen printed aluminum pastes for the BSF formation on silicon solar cells", 20th European Photovoltaic Solar Energy Conference, 2005, page 1466) that in order to achieve a closed BSF without discontinuities there is a need for a closed liquid Al—Si layer on the surface at the peak firing temperature. Therefore, a minimum of 6 mg/cm$^2$ deposited amount of aluminum paste may be required. When using an Al alloying process comprising screen printing and firing for the formation of a BSF in p-type cells, discontinuities in the doped region may lead to higher back surface recombination velocities.

However, when using an aluminum screen printing and firing process for the formation of an emitter of an n-type silicon photovoltaic cell, the process needs to be further optimized. Process parameters such as the quantity of paste and the firing conditions are more critical when this process is used to form an Al-alloyed emitter region on n-type cells. Any discontinuity in the junction can lead to shunt paths in the cells, thereby significantly reducing the conversion efficiency of the cells.

Studies related to the formation of an Al-alloyed emitter by screen printing and firing on n-type photovoltaic cells show that the problem of shunt paths (caused by discontinuities in the junction) exist even when using an amount of screen printing Al paste up to 7.5 mg/cm$^2$. Since the cost of the screen printing paste is an important part of the total cost of a cell process, a higher quantity of paste required will result in an increased cell cost. Furthermore, higher quantities of screen printing paste lead to more bowing of the cells. This will be even more critical when making cells on very thin substrates.

Recently the junction discontinuities in n-type silicon photovoltaic cells with an Al alloyed emitter formed by firing a screen printed Al paste have been reduced by optimizing the firing conditions (Ly Mai et al, "Improved process for the formation of Al-alloyed emitter in n-type solar cells", 18th Int. Photovoltaic Science Engineering Conf., India, January 2009). The optimized process involves a low temperature solid phase epitaxial growth process after the conventional standard spike firing to minimize the impact of junction discontinuities.

SUMMARY OF CERTAIN INVENTIVE ASPECTS

Certain inventive aspects reduce the amount of doping element paste without increasing the risk for discontinuities in the doped region.

Thereto, a highly pure doping element layer is applied to the semiconductor layer after which the paste layer is screen printed to the doping element layer.

It has been found that such a method allows reducing the amount of doping element paste without increasing the risk for discontinuities in the doped region as will be illustrated later on.

Certain inventive aspects relate to a method of forming a doped region in a silicon substrate or in a silicon layer of a substrate by Al alloying, the method comprising screen printing of an Al containing paste followed by paste firing, wherein the method allows forming a doped region of good quality with a substantial reduction of discontinuities as compared to prior art methods, even when using low quantities of Al containing paste, for example about 5 mg/cm$^2$ or less. A method according to one aspect can advantageously be used for Al alloying of p-type silicon, for example for the formation of a BSF in p-type photovoltaic cells. A method according to one aspect can advantageously be used for Al alloying of n-type silicon, for example for the formation of an emitter region in n-type photovoltaic cells.

It is an advantage of a method according to one aspect that the amount of Al containing paste can be reduced as compared to prior art methods, thus leading to a more cost effective process and reducing bowing of the cells.

One inventive aspect relates to a method of forming a doped region (or doped regions) in a semiconductor, for example silicon, substrate by alloying with doping elements, for example by aluminum alloying, the method comprising: providing a highly pure doping element; for example aluminum, layer on the silicon substrate, screen printing a layer of doping element, for example the aluminum, containing paste on the doping element layer, for example the pure aluminum layer, and performing a paste firing step. The doping element containing paste, for example the aluminum containing paste, in the context of this application is called the doping element paste.

In one aspect, a highly pure doping element layer, for example a highly pure aluminum layer, is a layer with purity higher than about 99.9%. Such highly pure doping element layer, for example aluminum layer, can for example be provided by a Physical vapor deposition method such as sputtering, ion beam evaporation, thermal evaporation, or by a chemical vapor deposition method such as for example ALD (atomic layer deposition). The thickness of the highly pure doping element layer, for example highly pure aluminum layer, is preferably less than about 3 micrometer, for example in the range between about 0.2 micrometer and 2 micrometer, for example between about 0.2 micrometer and 1 micrometer.

In a method according to one aspect the semiconductor substrate, for example silicon substrate, can for example be a monocrystalline substrate or a multicrystalline substrate. However, the disclosure is not limited thereto. In case of an n-type substrate, a method can be used for forming a p-n junction, for example of a photovoltaic cell. In case of a p-type substrate, a method can be used for forming a BSF (back surface field) region of a photovoltaic cell.

Screen printing a layer of doping element, for example aluminum, containing paste may comprise screen printing an amount of paste less than about 10 $mg/cm^2$, preferably less than about 7 $mg/cm^2$, for example in the range between about 2 $mg/cm^2$ and 5 $mg/cm^2$.

The paste firing step may be done in a belt furnace and may for example comprise heating the substrate (with the aluminum layer and the aluminum paste) to a temperature in the range between about 870° C. and 1000° C., for example in the range between about 900° C. and 970° C.

According to one inventive aspect, the doping element layer is sandwiched between the paste layer and the semiconductor layer.

According to one inventive aspect, the doping element layer directly contacts the paste layer and the semiconductor layer.

Certain objects and advantages have been described herein above. Of course, it is to be understood that not necessarily all such objects or advantages may be achieved in accordance with any particular embodiment of the disclosure. Thus, for example. those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

DETAILED DESCRIPTION OF CERTAIN ILLUSTRATIVE EMBODIMENTS

Figure 1:
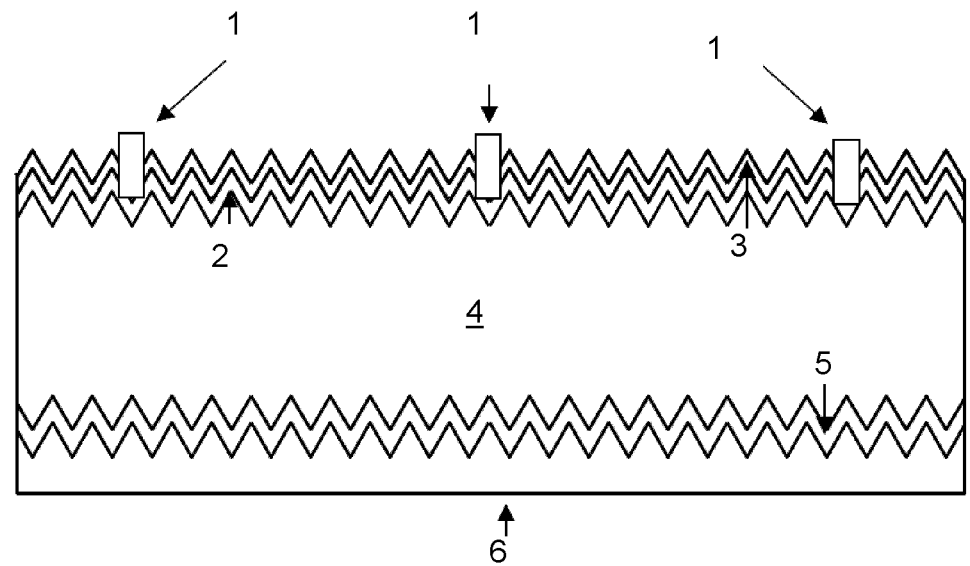
FIG. 1 is a schematic representation (cross section) of an n-type Al-alloyed emitter rear junction photovoltaic cell.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and in the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" used in the claims should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, the front surface or front side of a photovoltaic cell is the surface or side adapted for being oriented towards a light source and thus for receiving illumination. The back surface, back side, rear surface or rear side of a photovoltaic cell is the surface or side opposite to the front surface.

One embodiment relates to a method of forming doped regions in a silicon substrate by aluminum alloying, the method comprising: providing a highly pure aluminum layer on the silicon substrate, such as for example by CVD (chemical vapor deposition) or PVD (physical vapor deposition), screen printing an aluminum containing paste on the pure aluminum layer, and performing a paste firing step.

However, the semiconductor substrate does not need to be silicon and the semiconductor substrate can also be, for example, germanium or other semiconductor materials deemed appropriate by the person skilled in the art.

Also, the doping element does not need to be aluminum and also other doping elements are possible.

In one embodiment, the method can advantageously be used for forming a good quality junction in an n-type silicon substrate, for example for forming an emitter of an n-type silicon photovoltaic cell. The method can also advantageously be used for forming a good quality back surface field for a p-type silicon photovoltaic cell.

It was surprisingly found that providing a layer of highly pure doping element, such as for example aluminum, (e.g. sputtered or evaporated) on the substrate before screen printing the doping element, such as for example aluminum, containing paste leads to an improved uniformity of the doping element alloyed layer, for example the Al-alloyed layer, after firing, as compared to prior art methods. It was found that, when using a stack comprising a thin, highly pure doping element, for example Al, layer and a layer of screen printed doping element, for example Al, paste for forming a doping element, for example Al, alloyed emitter, the discontinuities (shunts) in the doping element alloyed, for example Al-alloyed, emitter were strongly reduced as compared to prior art methods, wherein only a layer of screen printed doping element, for example Al, paste is used for forming the Al alloyed emitter. Adding a highly pure doping element, for example Al, layer under the layer of screen printed doping element, for example aluminum, paste for forming a doping element alloyed, for example Al-alloyed, emitter of photovoltaic cells resulted in a substantial increase in shunt resistance of the photovoltaic cells, even when a low quantity of doping element, for example aluminum, paste was used.

N-type Al emitter rear junction photovoltaic cells were fabricated having a structure as schematically shown in FIG. 1. The cells were fabricated using about 180 micrometer thick, n-type multi-crystalline silicon wafers 4 (125 mm×125 mm) with a resistivity in the range between about 1 and 4 Ohm cm. The process sequence started with acidic texturing, followed by phosphorus gettering, phosphorus-diffusion at the front side of the substrate for forming an n+ front surface field (FSF) 2, and deposition of a PECVD $SiN_x$ layer 3 as antireflective coating on the front side. Next an about 2 micrometer thick layer of Al was provided at the rear side by Al sputtering or evaporation, followed by screen printing of an Ag paste at the front side for forming front side contacts 1 and screen printing of an Al paste at the rear side for forming an Al alloyed emitter 5 at the rear side and for forming rear side contacts 6.

Experiments were done with different quantities of Al paste screen printed at the rear side of the cells. Three types of screens with different mesh sizes were used to screen print various quantities of aluminum paste, in the range between 5 mg/cm$^2$ and 9 mg/cm$^2$ (corresponding to a thickness of the paste layer in the range between about 30 micrometer and about 50 micrometer). After screen printing, the paste was dried in a belt furnace at 300° C. The paste was then fired at a peak firing temperature of about 900° C. FIG. 2 shows the effect of the quantity of screen-printed Al on the fill factor FF (FIG. 2(a)), the open-circuit voltage Voc (FIG. 2(b)), the short-circuit current density $J_{sc}$ (FIG. 2(c)) and the energy conversion efficiency (FIG. 2(d)) of the photovoltaic cells. Results are shown for cells wherein the Al-alloyed emitter was formed with only a screen printed Al layer according to the prior art (triangles), with a stack comprising an evaporated Al layer and a screen printed Al layer according to one embodiment (squares) and with a stack comprising a sputtered Al layer and a screen printed Al layer according to one embodiment (diamonds).

For cells wherein only screen printed Al was used for forming the emitter, the fill factor shows a very strong dependence on the quantity of screen printed Al. The fill factors increases nearly linearly from 46% to 77% with increasing Al paste quantity from 5.2 mg/cm$^2$ to 8.5 mg/cm$^2$ (FIG. 2(a)). However, when using a stack comprising a 2 micrometer thick layer of highly pure Al (sputtered or evaporated) and a layer of screen printed Al, the firing step results in much higher fill factors, ranging from about 72% to more than 80% for increasing quantities of screen printed Al paste.

Figure 2A:
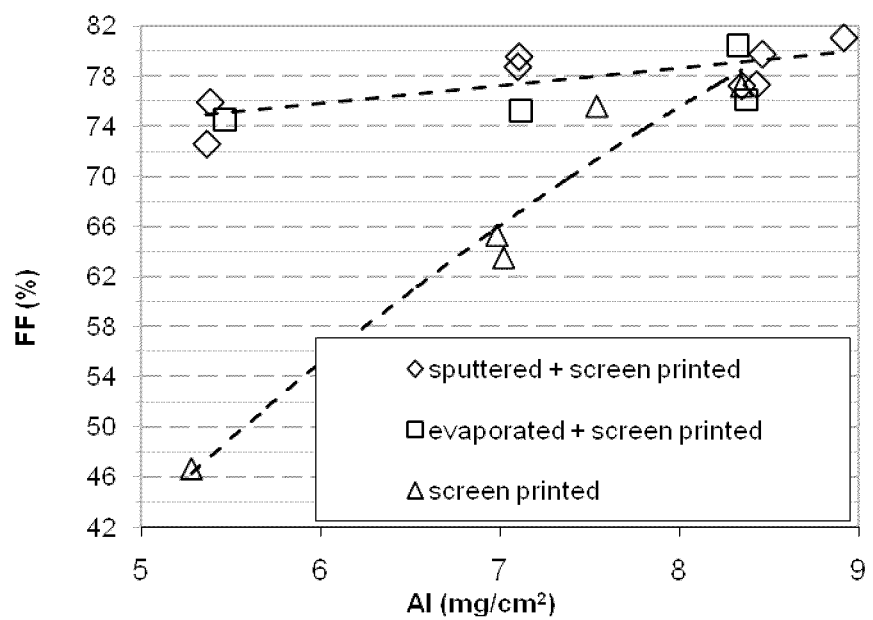
FIG. 2 shows measured photovoltaic cell parameters for cells with an Al-alloyed emitter, as a function of the amount of aluminum paste used, and for different alloying methods.
Figure 2B:
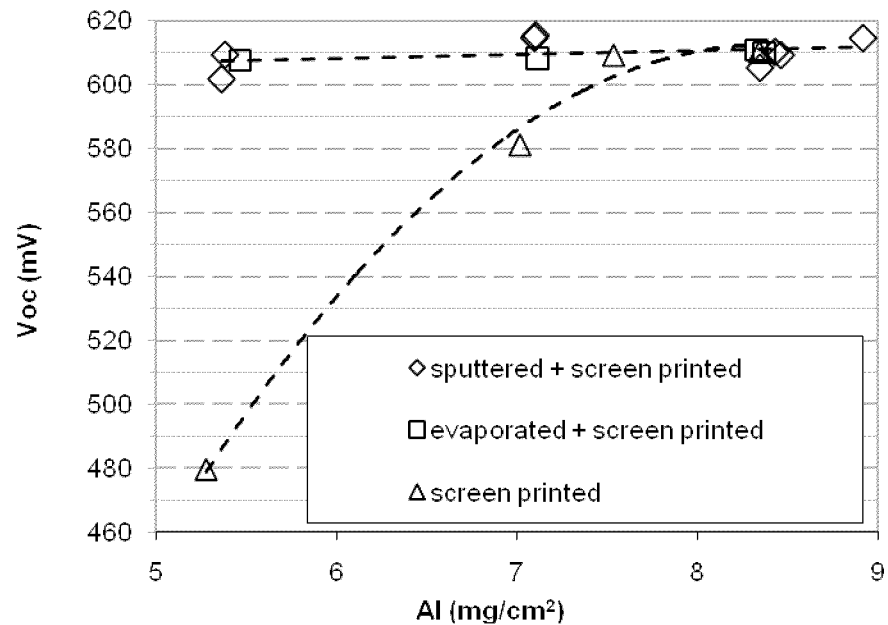

As shown in FIG. 2(b), the open-circuit voltage shows a similar behavior. When using only a layer of screen printed Al paste, the open-circuit voltage increases from about 475 mV to about 610 mV for increasing amount of Al paste. When using a method according to one embodiment, open-circuit voltages higher than 600 mV are also obtained for low quantities of Al paste.

Figure 2C:
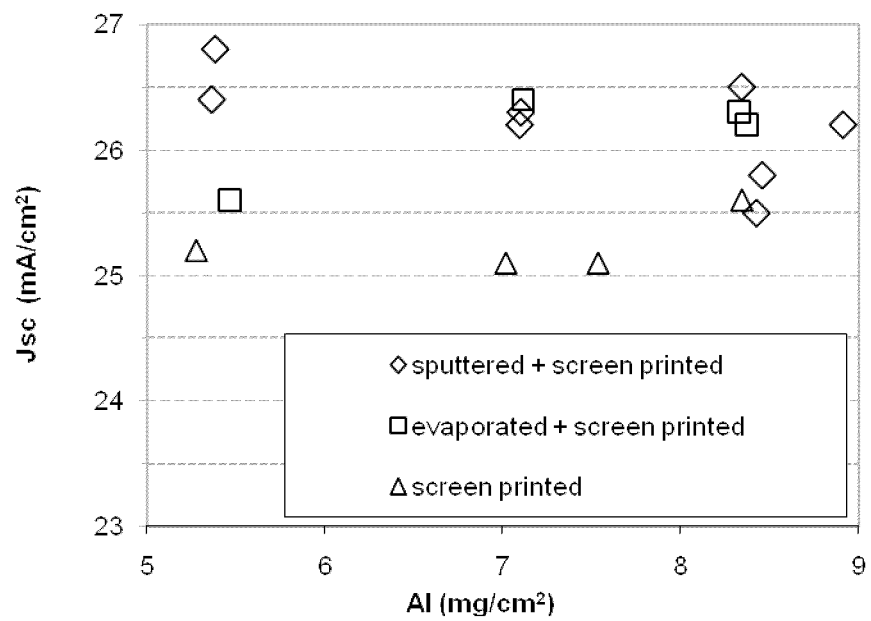

FIG. 2(c) shows the short-circuit current density as a function of the quantity of screen printed Al. The short-circuit current density also shows a clear increase when adding pure Al under the screen printed Al layer, but the dependence on the amount of Al paste is less pronounced than for the fill factor and the open-circuit voltage.

Figure 2D:
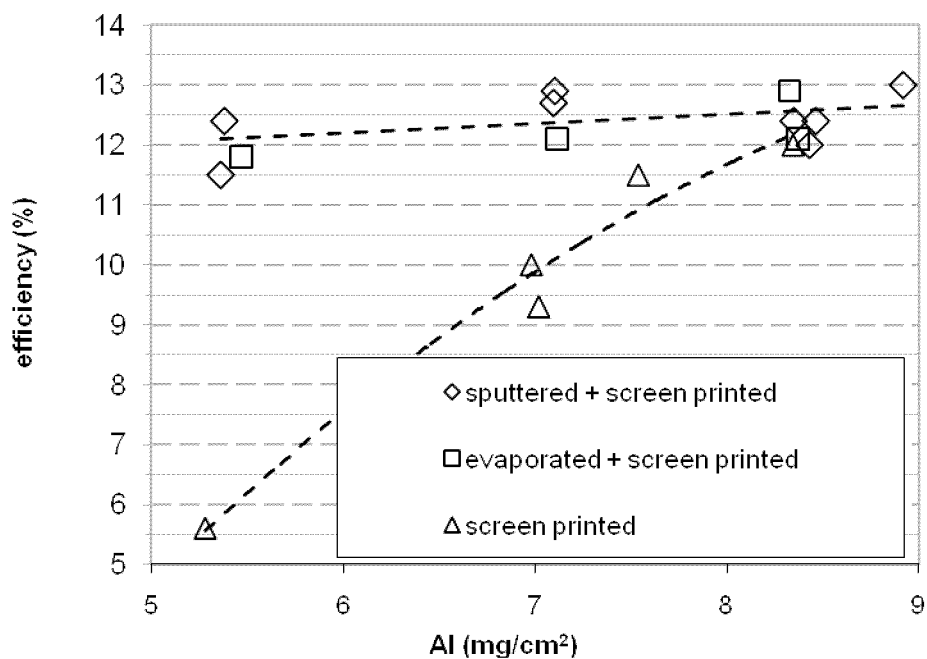

The energy conversion efficiency of the photovoltaic cells (FIG. 2(d)) follows a trend similar to the fill factor and the open-circuit voltage. No clear difference in results was observed between samples with evaporated Al and samples with sputtered Al as a highly pure Al layer.

Figure 3A:
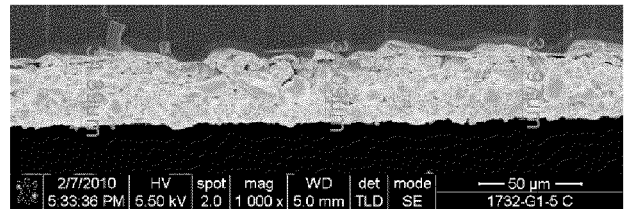
FIG. 3 shows SEM cross sections of Al alloyed junctions, for a prior art Al alloying method (FIG. 3(a) and FIG. 3(b)) and for an Al alloying method according to one embodiment (FIG. 3(c) and FIG. 3(d)).
Figure 3B:
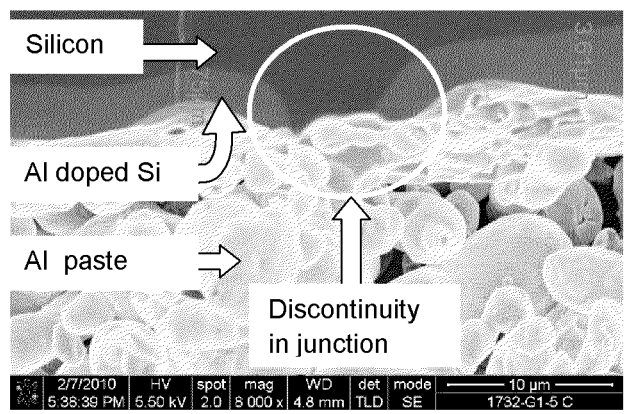
Figure 3C:
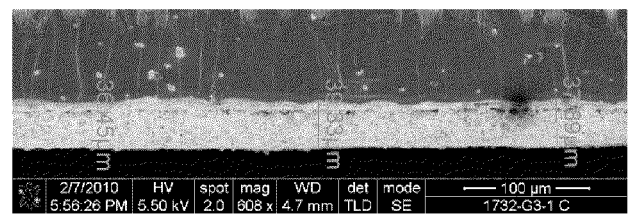
Figure 3D:
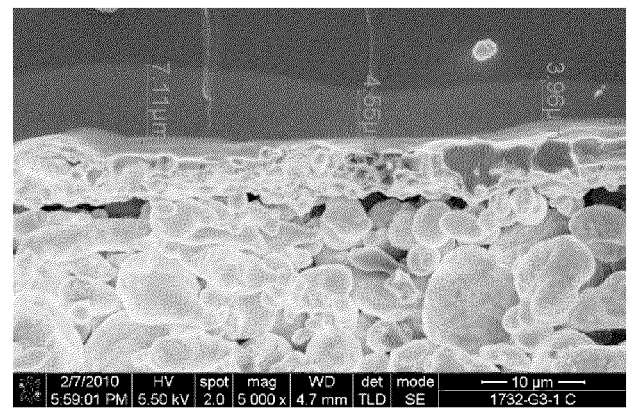

Cross-sections of the Al-alloyed junctions were studied by scanning electron microscopy (SEM). The SEM images of the junctions formed with the smallest quantity of screen printed aluminum paste (5.2 mg/cm$^2$) are shown in FIG. 3. FIG. 3(a) and FIG. 3(b) show SEM images for a sample wherein only screen printed Al was used for Al alloying (according to the prior art). These images clearly show a discontinuity in the Al-alloyed junction and large variations in emitter thickness. The discontinuities lead to shunting of the junction, which correlates well with the very low value of shunt resistance that was measured for this sample (~90 $\Omega.cm^2$). FIG. 3(c) and FIG. 3(d) show SEM images of a sample wherein the junction was formed according to a method in one embodiment, using a stack comprising a 2 micrometer thick sputtered Al layer and a screen printed Al layer. It can be observed that this method leads to a more uniform junction formation, which leads to less shunting paths in the junction. This was confirmed by a higher shunt resistance (~350 $\Omega.cm^2$) and hence a higher fill factor of the cells.

Obtaining a uniform junction with a lower quantity of paste is not only important for cost reduction but also leads to less bowing of the cells. This can be of significant importance for future thinner cells.

Experiments were performed wherein only a 2 micrometer thick sputtered Al layer was provided on an n-type silicon substrate (without a screen printed Al paste), followed by a firing step for forming an Al alloyed emitter. A photovoltaic cell comprising such an emitter had a FF of 25% and a Voc of 218 mV. This clearly indicates that this approach does not lead to a uniform emitter or to an emitter that is too thin or too lowly doped, and that there is a need for combining the sputtered Al layer with e.g. a layer formed by a screen printed Al paste.

Figure 4:
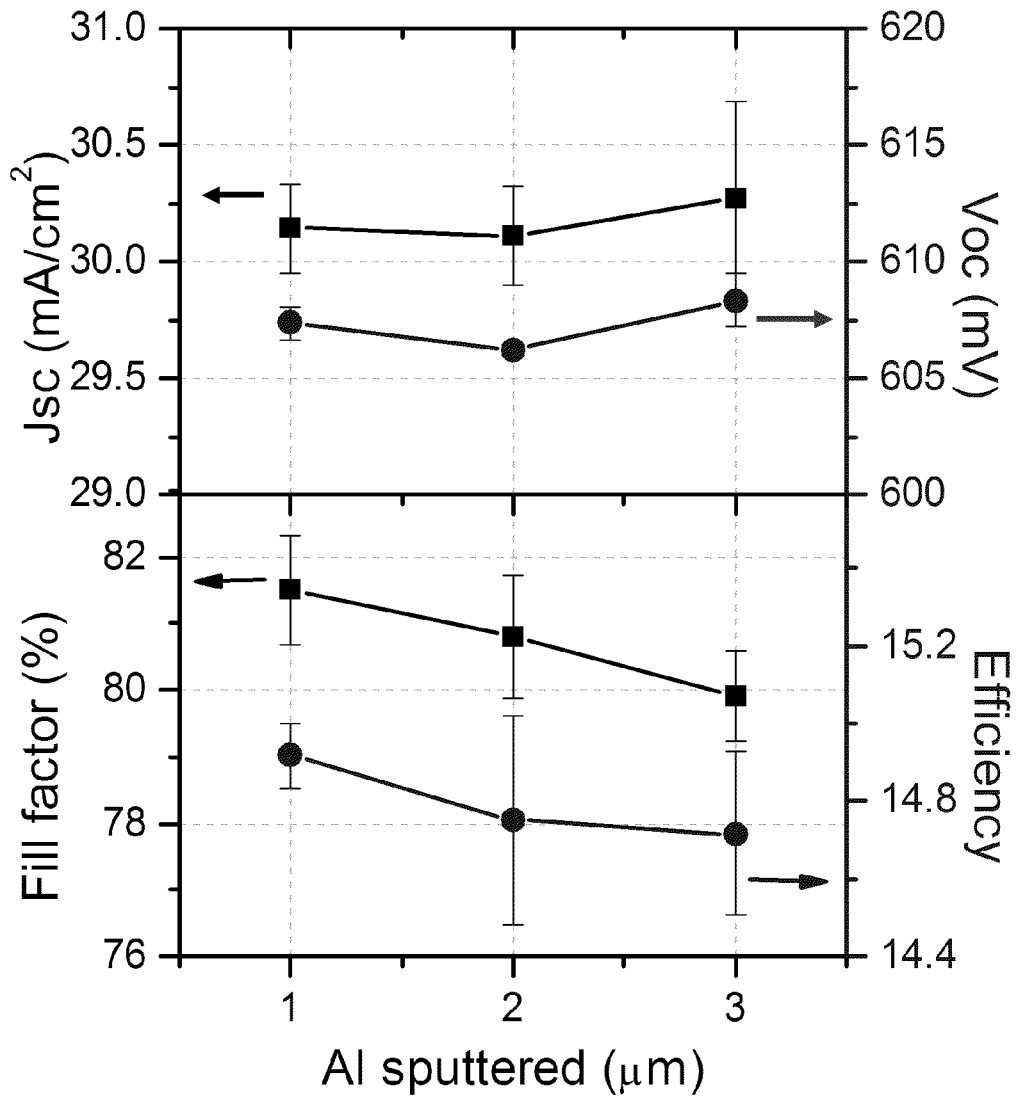
FIG. 4 shows measured I-V parameters for silicon photovoltaic cells with an emitter formed according to one embodiment, as a function of the thickness of the highly pure Al layer.

In order to study the effect of the thickness of the highly pure Al layer provided under the layer of screen printed Al paste in certain embodiments of the present invention, an analysis was performed of cells having an emitter junction formed by Al alloying with a stack comprising a sputtered Al layer with a thickness of about 1 micrometer, 2 micrometer and 3 micrometer respectively, and an about 10.5 mg/cm$^2$ screen printed Al layer on top of it. The current-voltage parameters of the cells are shown in FIG. 4. The fill factor of the cells shows a monotonic decrease with increasing thickness of the sputtered layer. It was observed that 1 micrometer of highly pure Al resulted in a high fill factor up to about 82.2%. $J_{sc}$ and $V_{oc}$ of the cells did not show a clear trend. The cells with a 1 μm thick sputtered Al layer showed the highest efficiency of about 15% on 180 micrometer thick wafers.

In order to further optimize the thickness of the highly pure Al layer, an analysis was performed for cells having an emitter junction formed by Al alloying with a stack comprising a sputtered Al layer with at thickness of about 0.25 micrometer, 0.5 micrometer and 1 micrometer respectively, and an about 5.2 mg/cm² screen printed Al layer. As a reference, also cells having an emitter formed by alloying with an about 5.2 mg/cm² screen printed Al layer (without highly pure Al layer underneath) were analyzed. The current-voltage parameters of the cells are shown in FIG. 5. Firing conditions were also improved to reduce shunt paths in the cells.

Figure 5A:
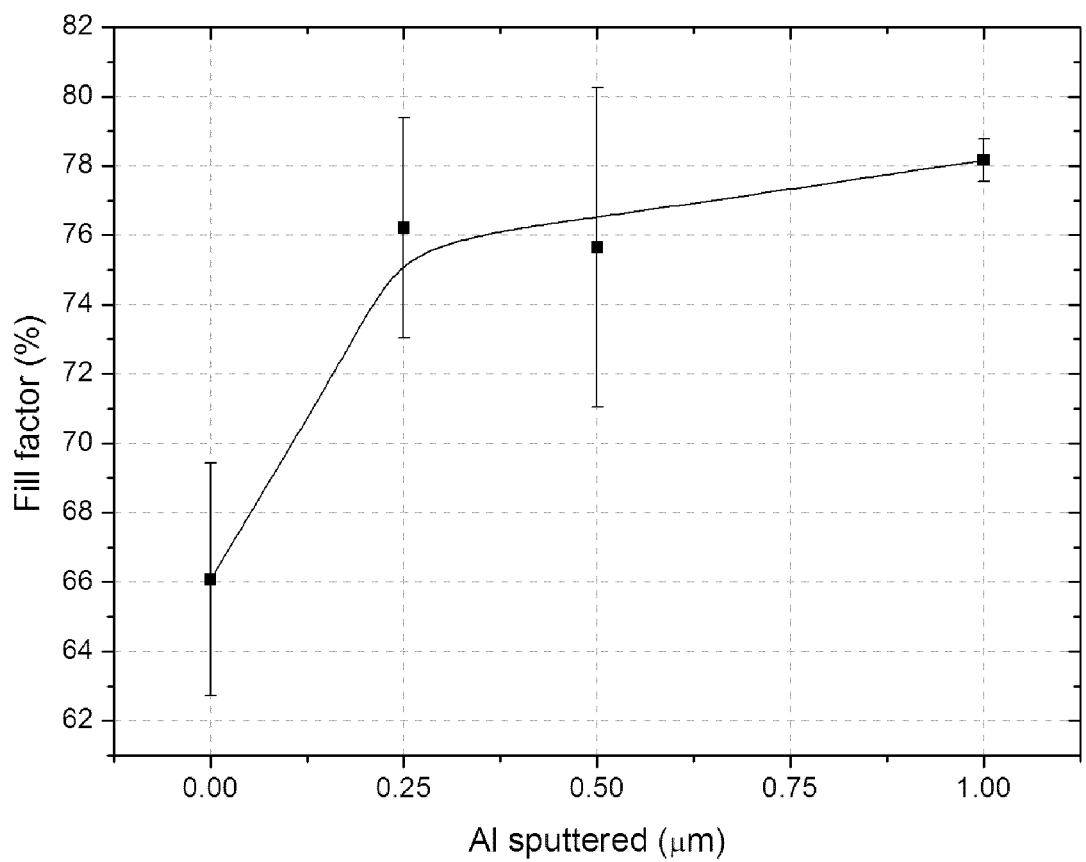
FIG. 5 shows measured I-V parameters for silicon photovoltaic cells with an emitter formed according to one embodiment, as a function of the thickness of the highly pure Al layer.

FIG. 5(a) shows the measured Fill Factor as a function of the highly pure Al layer thickness. For cells with only a screen-printed Al layer for forming the emitter, the average value of the fill factor was measured and found to be 66%±3%. Although the fill factor showed an improvement with improvement in firing conditions, the cells were still clearly shunted. Interestingly, the cells with only 0.25 micrometer of highly pure Al showed a significant improvement in fill factor. The average fill factor was found to be 76%±3%. The cells with increased pure Al layer thickness up to about 1 micrometer, showed relatively small further improvements in fill factor, up to 78%±1%.

Figure 5B:
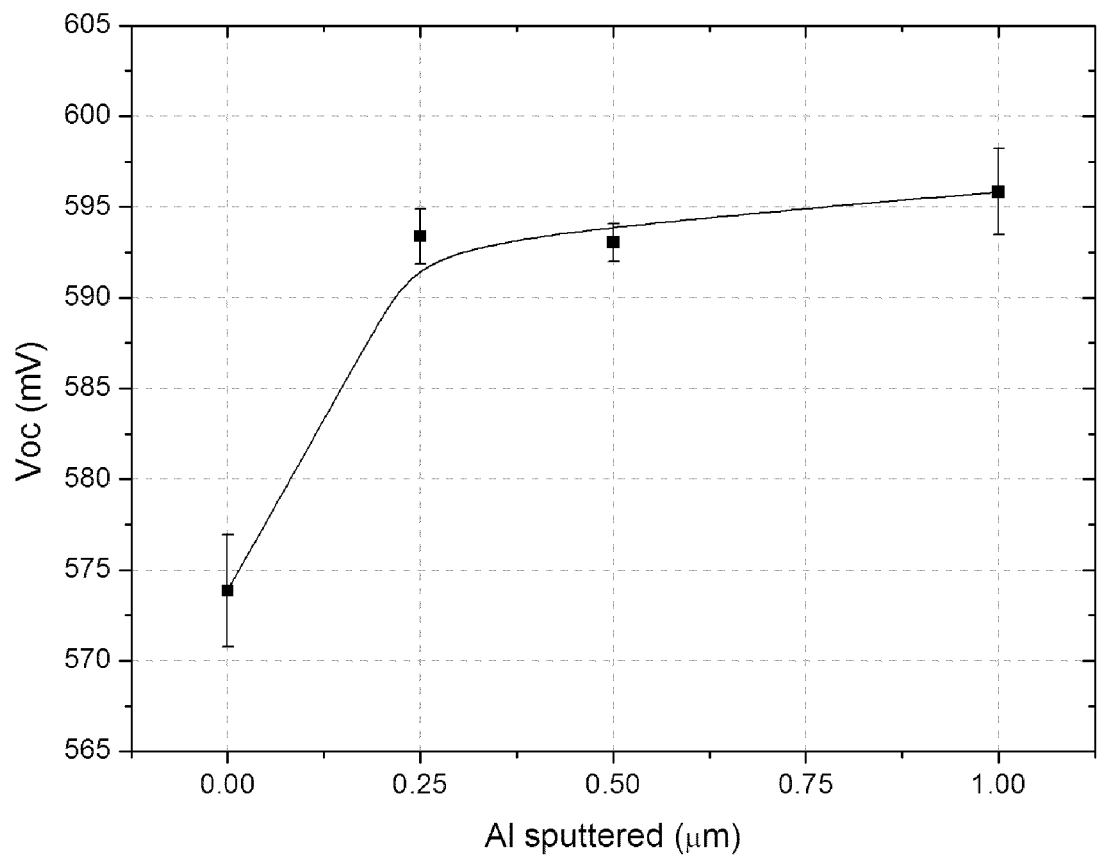

Similar features were observed for the open-circuit voltage $V_{oc}$ of the cells (FIG. 5(b)). The cells with a 0.25 micrometer thick highly pure Al layer showed a much improved open-circuit voltage of 593 mV±2 mV as compared to 574 mV±3 mV for the reference cells. The cells with a highly pure Al layer of 1 micrometer thickness show a small additional improvement in $V_{oc}$ up to 596 mV±2 mV.

Figure 5C:
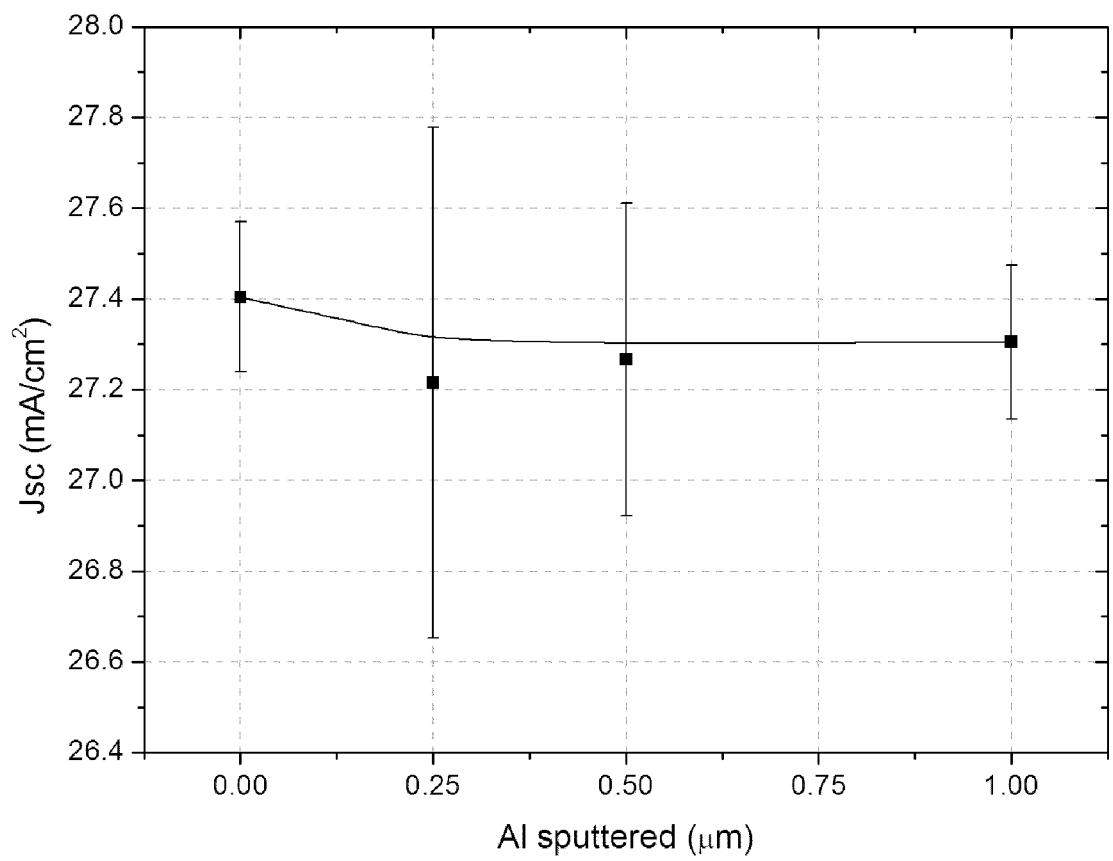

The short-circuit current of the cells did not show any clear trend (FIG. 5(c)). The values of short-circuit current were within the larger error margins. The average value of short-circuit current density for all conditions was within the range 27.2 mA/cm² to 27.4 mA/cm².

Figure 5D:
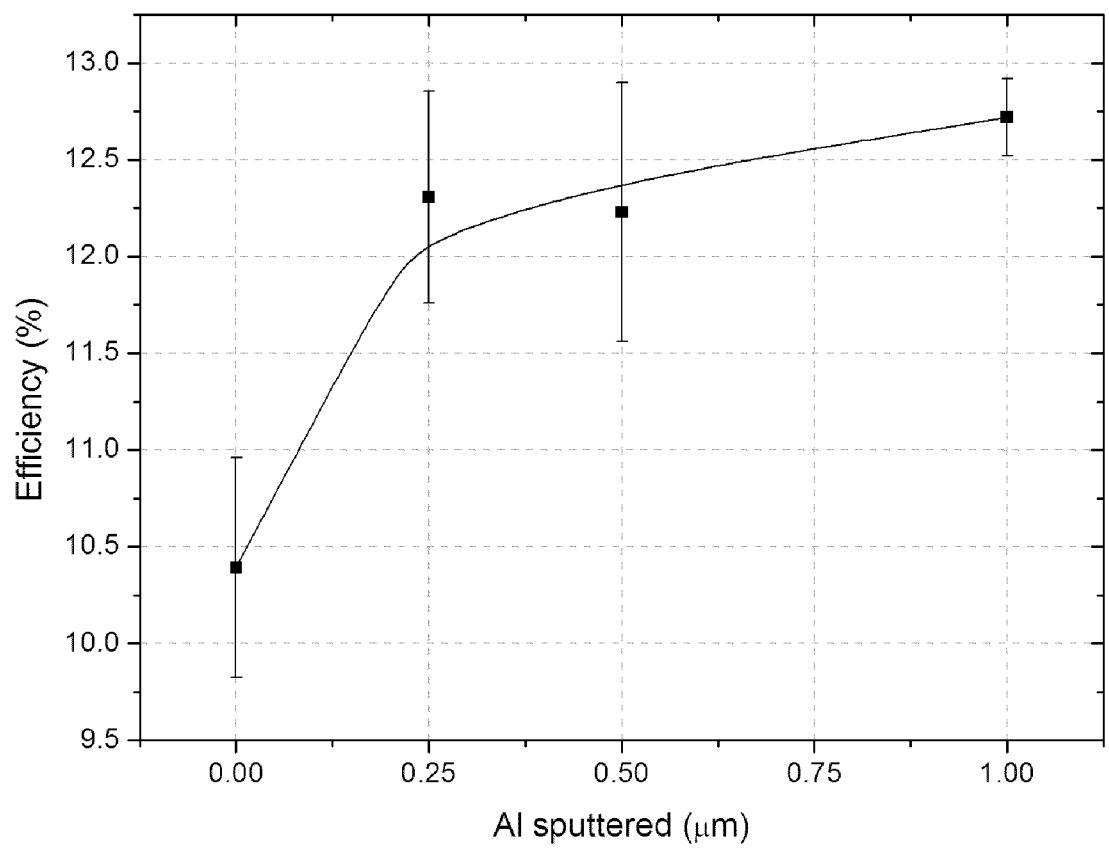

The energy conversion efficiency of the cells, shown in FIG. 5(d), follows the same trend as the fill factor and the open-circuit voltage. It shows a significant increase for a 0.25 micrometer thick highly pure Al layer as compared to the reference cell, and a relatively smaller additional increase with increasing thickness of the highly pure Al layer.

These results show that depositing a very thin layer of pure Aluminum (only 0.25 micrometer) with very small quantity of screen printed Al paste (5.2 mg/cm²) can lead to fill factors of 76±3%. Apart from the advantage of cost reduction, these results are particularly significant for reducing bowing of cells made with very thin wafers. This makes Al alloying an interesting alternative to boron diffusion for very thin cells.

Figure 6:
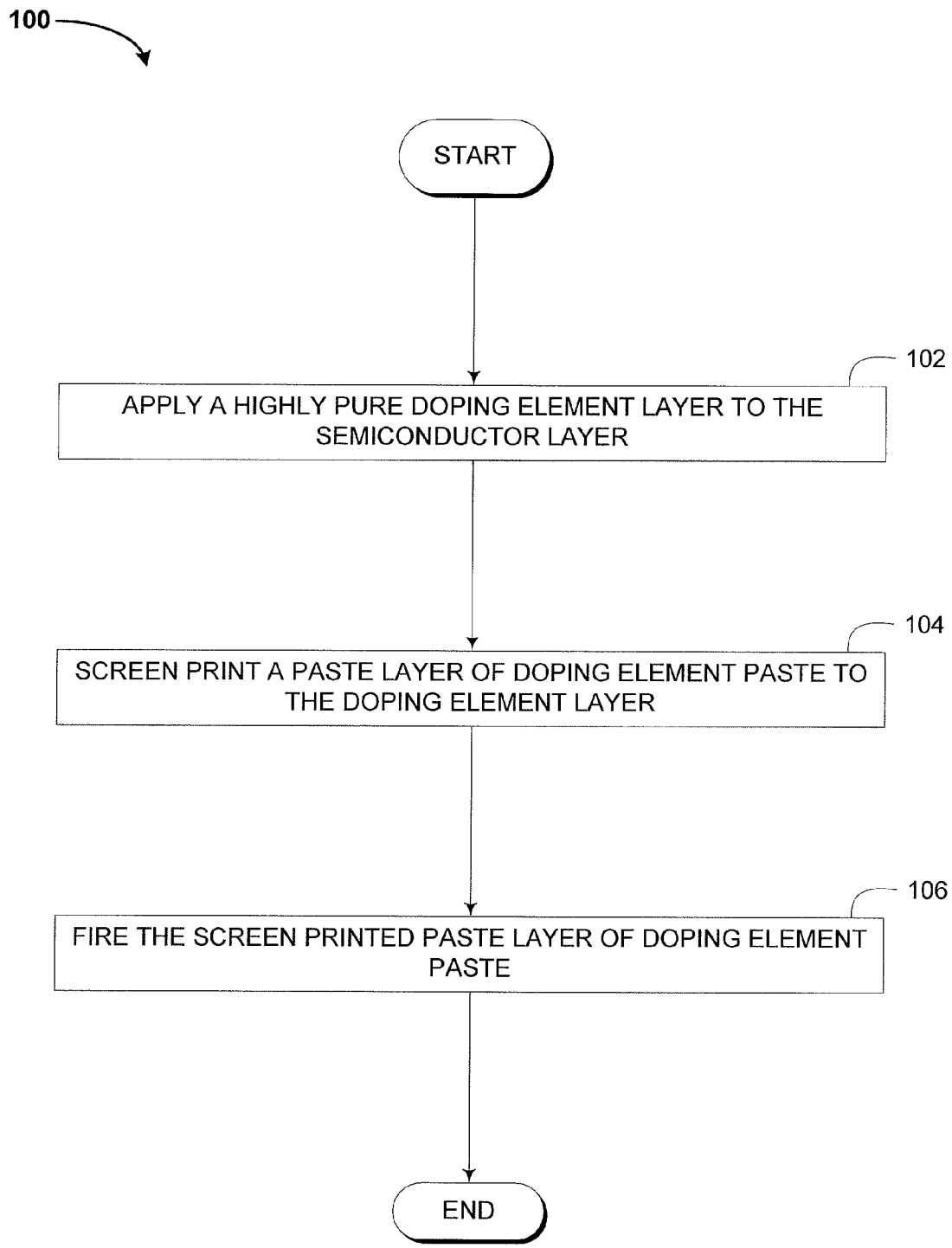
FIG. 6 shows a flowchart of one embodiment of a method of forming a doped region in a semiconductor layer of a substrate.

FIG. 6 shows a flowchart of one embodiment of a method of forming a doped region in a semiconductor layer of a substrate by alloying with doping elements. At a block 102, the method 100 includes applying a highly pure doping element layer to the semiconductor layer. Next at a block 104, the method includes screen printing a paste layer of doping element paste to the doping element layer. The method may optionally include a block 106, wherein the screen printed paste layer of doping element paste is fired.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of forming a doped region in a semiconductor layer of a substrate by alloying with doping elements, the method comprising:
applying a highly pure doping element layer to the semiconductor layer;
after the doping element layer is applied, screen printing a paste layer of doping element paste to the doping element layer; and
firing the screen printed paste layer of doping element paste.

2. The method according to claim 1, wherein the doping element layer is sandwiched between the paste layer and the semiconductor layer.

3. The method according to claim 1, wherein the doping element layer directly contacts the paste layer and the semiconductor layer.

4. The method according to claim 1, wherein the semiconductor layer is a silicon layer.

5. The method according to claim 1, wherein the semiconductor layer is a doped layer.

6. The method according to claim 5, wherein the semiconductor layer is a n-type layer.

7. A method of forming a p-n junction, the method comprising forming a doped region in a semiconductor layer of a substrate according to the method of claim 6.

8. The method according to claim 5, wherein the semiconductor layer is a p-type layer.

9. A method of forming a back surface field region of a photovoltaic cell, the method comprising forming a doped region in a semiconductor layer of a substrate according to the method of claim 8.

10. The method according to claim 1, wherein the doping element is aluminum.

11. The method according to claim 1, wherein the highly pure doping element layer is applied to the semiconductor layer using physical vapor deposition or using chemical vapor deposition.

12. The method according to claim 1, wherein an amount of less than about 10 mg/cm² of paste is screen printed to the substrate.

13. The method according to claim 1, wherein an amount of less than about 7 mg/cm² of paste is screen printed to the substrate.

14. The method according to claim 1, wherein an amount in the range between about 2 mg/cm² and 5 mg/cm² of paste is screen printed to the substrate.

15. The method according to claim 1, wherein the firing comprises heating the substrate comprising the semiconductor layer, the highly pure doping element layer and the paste layer to a temperature in the range between about 870° C. and 1000° C.

16. The method according to claim 1, wherein the firing comprises heating the substrate comprising the semiconductor layer, the highly pure doping element layer and the paste layer to a temperature in the range between about 900° C. and 970° C.

17. The method according to claim 1, wherein the thickness of the highly pure doping element layer is less than about 3 micrometer.

18. The method according to claim 1, wherein the thickness of the highly pure doping element layer is in the range between about 0.2 micrometer and 2 micrometer.

19. The method according to claim 1, wherein the thickness of the highly pure doping element layer is in the range between about 0.2 micrometer and 1 micrometer.

20. The method according to claim 1, wherein the purity of the doping element layer is at least about 99.9%.

21. A device comprising a doped region in a semiconductor layer of a substrate as formed by a method according to claim 1.

22. A method of forming a doped region in a semiconductor layer, the method comprising:
   applying a highly pure doping element layer to the semiconductor layer; and
   subsequently screen printing a layer of doping element paste to the doping element layer.

* * * * *